(12) United States Patent
Ordonez Orellana et al.

(10) Patent No.: US 11,358,861 B2
(45) Date of Patent: Jun. 14, 2022

(54) ENCAPSULATION OF SENSING DEVICE

(71) Applicant: INDIGO DIABETES NV, Ghent (BE)

(72) Inventors: Juan Sebastian Ordonez Orellana, Ghent (BE); Pieter Espeel, Heurne (BE)

(73) Assignee: INDIGO DIABETES NV, Ghent (BE)

( * ) Notice: Subject to any disclaimer, the term of this patent is extended or adjusted under 35 U.S.C. 154(b) by 19 days.

(21) Appl. No.: 16/641,862

(22) PCT Filed: Aug. 28, 2018

(86) PCT No.: PCT/EP2018/073145
§ 371 (c)(1),
(2) Date: Feb. 25, 2020

(87) PCT Pub. No.: WO2019/043010
PCT Pub. Date: Mar. 7, 2019

(65) Prior Publication Data
US 2020/0207612 A1    Jul. 2, 2020

(30) Foreign Application Priority Data
Aug. 28, 2017  (EP) .................................... 17188190

(51) Int. Cl.
*B81C 1/00*    (2006.01)
*B81B 7/00*    (2006.01)
(52) U.S. Cl.
CPC ........ *B81B 7/0051* (2013.01); *B81C 1/00309* (2013.01); *B81C 2203/0154* (2013.01)
(58) Field of Classification Search
CPC .......................... B81B 7/0051; B81C 1/00309
See application file for complete search history.

(56) References Cited

U.S. PATENT DOCUMENTS

| 8,937,380 B1 | 1/2015 | Vaupel et al. |
| 2005/0267440 A1* | 12/2005 | Herman ............ A61B 5/14528 604/20 |

(Continued)

FOREIGN PATENT DOCUMENTS

| EP | 1708279 A2 | 10/2006 |
| EP | 2280415 A2 | 2/2011 |

(Continued)

OTHER PUBLICATIONS

Zeniieh et al., "Parylene-C as High Performance Encapsulation Material for Implantable Sensors," Procedia Engineering, vol. 87, 2014, pp. 1398-1401.

(Continued)

*Primary Examiner* — Moazzam Hossain
(74) *Attorney, Agent, or Firm* — Workman Nydegger

(57) ABSTRACT

A method for encapsulating a sensing and/or actuator device, comprises the steps of providing a sensing and/or actuator device having a demarcation structure thereon. The sensing and/or actuator device comprises at least a substrate and a sensing and/or actuator element on the substrate. The demarcation structure contacts the substrate and defines an enclosed area of the substrate. The enclosed area comprises at least the sensing and/or actuator element. The method also comprises providing an encapsulation material outside the enclosed area, so the sensing and/or actuator element is left uncovered by the encapsulation material. The demarcation structure further comprises a capping structure overlaying the sensing and/or actuator element.

15 Claims, 3 Drawing Sheets

(56) References Cited

U.S. PATENT DOCUMENTS

| | | |
|---|---|---|
| 2009/0020862 A1 | 1/2009 | Chen et al. |
| 2009/0027869 A1 | 1/2009 | Uchida et al. |
| 2009/0127690 A1 | 5/2009 | Jaducana et al. |
| 2010/0068461 A1* | 3/2010 | Wallace ............. B81C 1/00111 428/156 |
| 2010/0096717 A1 | 4/2010 | Uchida et al. |
| 2011/0165365 A1 | 7/2011 | Brault et al. |
| 2015/0344298 A1* | 12/2015 | Shimooka ............ B81B 7/0051 257/369 |
| 2015/0362451 A1* | 12/2015 | Hunziker ........... G01N 33/0009 73/31.06 |

FOREIGN PATENT DOCUMENTS

| | | |
|---|---|---|
| WO | 9307457 A1 | 4/1993 |
| WO | 2013066343 A1 | 5/2013 |

OTHER PUBLICATIONS

European Search Report from EP Application No. EP17188190, dated Jan. 4, 2018.
International Search Report and Written Opinion from PCT Application No. PCT/EP2018/073145, dated Oct. 25, 2018.

* cited by examiner

ENCAPSULATION OF SENSING DEVICE

TECHNICAL FIELD OF THE INVENTION

The present invention relates to the encapsulation of sensing and/or actuator devices and in particular to the use of a demarcation structure during said encapsulation, as well as systems thus obtained.

BACKGROUND OF THE INVENTION

In the fabrication of sensing devices, particularly sensing devices in the form of implantable microdevices, there is typically a need to encapsulate the device (which is also referred to as 'molding' in the art) while keeping specific sections of the sensing device exposed. The purpose of the encapsulation is to protect the device against malfunctioning or degradation because of harsh environmental conditions (e.g. corrosion when implanted or submerged in water). However, exposing the sensor to the analyte can be crucial for the adequate functioning of the device. Typically, the encapsulation material (e.g. silicone rubber), in order to form a good encapsulation, presents a diffusion barrier for ions and other possible analytes; yet, in doing so, the encapsulation material also prevents the analyte from nearing the sensor close enough to be measured.

In common practice, e.g. as exemplified by Zeniieh et al. in "Parylene-C as High Performance Encapsulation Material for Implantable Sensors, Procedia Engineering 87 (2014) 139814101, coatings (e.g parylene deposited from the vapor phase) or castings (e.g. rubber or epoxy) are conformally deposited around the entire device. If a desired section is to be exposed, a post-process step of material removal is necessary (e.g. laser cutting or plasma etching). Since the sensors are typically fragile, this material removal step may easily damage such vulnerable sensors, and this at a relatively late stage in the fabrication process, resulting in loss. Also implementing the sensing area or sensing materials locally as a last step after opening the exposed area results in a complicated process flow.

Casting moulds used in the encapsulation of the sensing device are typically made of a relatively solid material (e.g. Teflon or PTFE-coated metal). Pressing the mould directly onto the sensing and/or actuator element to prevent encapsulation material from reaching that area requires large forces, which would damage the sensor. It is therefore ill-suited as an alternative approach for keeping a desired section exposed.

Furthermore, there may often also be a need to cover the exposed sections with a capping structure, such as a semi-permeable membrane. This practice can for example be useful to allow only select analyte molecules to reach the sensor. Moreover, by using a plurality of capping structures with differing selectivity in the same device, multi-sensor devices can be obtained comprising sensors which can measure analytes or analyte combinations selectively. Materials used to filter analyte must permit a specific diffusivity of liquid water, meaning that they integrate water into their matrix. This causes swelling and thus forces that can be detrimental to the interfacial adhesion between the membrane material and the encapsulant. Delamination of the membrane would result in leaking of undesired solution and thus falsify the sensor's input (resulting in failure of the membrane to filter). Some solutions suggest first encapsulating the full device and then locally removing the material. Nevertheless, the processes to succeed in this approach are very limited and the process window is very narrow; as such, a high risk of damaging the sensor at a late stage of the manufacturing process is again present.

There is thus still a need in the art for better methods for encapsulating sensing devices which address some or all of the problems outlined above.

SUMMARY OF THE INVENTION

It is an object of the present invention to provide good methods for encapsulating a sensing and/or actuator device as well as to sensing devices thus obtained. The above objective is accomplished by methods and devices according to the present invention.

In a first aspect, the present invention relates to a method for encapsulating a sensing and/or actuator device, comprising:

providing a sensing and/or actuator device having a demarcation structure thereon, the sensing and/or actuator device comprising at least a substrate and a sensor and/or actuator element on the substrate, the demarcation structure contacting the substrate and defining an enclosed area of the substrate, the enclosed area comprising at least the sensor and/or actuator element; and providing an encapsulation material outside the enclosed area, such that the sensor and/or actuator element is left uncovered by the encapsulation material.

It is an advantage of embodiments of the present invention that the sensing and/or actuator device can be encapsulated while leaving the sensor and/or actuator element uncovered by the encapsulation material (i.e. leaving the sensing and/or actuator element exposed). It is a further advantage of embodiments of the present invention that this can be achieved without the need for a post processing technique (e.g. plasma etching, wet etching, laser-assisted cutting or manual cutting) and/or a masking technique (e.g. masking with a photo resist or tape and subsequent removal of the mask after encapsulation). It is yet a further advantage of embodiments of the present invention, given that the sensor and/or actuator is typically a structure that is prone to damage from a plurality of external influences (e.g. processing conditions), that the encapsulation leaving the sensor and/or actuator element uncovered can be achieved without touching or otherwise negatively affecting the sensor and/or actuator element; furthermore, a yield improvement can therefore be obtained as less devices are damaged in the fabrication process.

In embodiments, step b may comprise casting the encapsulation material outside the enclosed area. It is an advantage of embodiments of the present invention that the encapsulation material may be provided conformally around the sensing and/or actuator device, e.g. in such a way that an encapsulation having a uniform thickness is obtained. Nevertheless, also a non-uniform encapsulation may be used depending on the design required.

In embodiments, a casting mould may be provided around the sensing and/or actuator device prior to the casting and the casting mould may be adapted to press the demarcation structure securely against the substrate. It is a further advantage of embodiments of the present invention that the demarcation structure can be held securely against the sensing and/or actuator device during casting.

In embodiments, the demarcation structure may have a height of from 10 µm to 1 cm or larger. It is advantage of embodiments of the present invention that the demarcation structure can be high enough to prevent overflowing of the encapsulation material onto the sensor and/or actuator element, while maintaining a suitable thickness of the encapsulation.

In embodiments, the demarcation structure may comprise one or more walls standing upon the substrate and defining a cavity between said walls.

In embodiments, the cavity may open up to a surrounding of the sensing and/or actuator device. It is an advantage of embodiments of the present invention that the sensing and/or actuator device can be encapsulated while leaving the sensor and/or actuator element open to the surroundings.

In embodiments, the demarcation structure further comprises a capping structure overlaying the sensor and/or actuator element. Alternatively, the method comprises positioning a capping structure on the demarcation structure after the encapsulation material is provided, the capping structure overlaying the sensing and/or actuator element. The demarcation structure therefore may comprise architectural elements to host the capping structure (or other elements), which can be subsequently mounted above the uncovered area of the sensor.

It is an advantage of embodiments of the present invention that the sensing and/or actuator device can be encapsulated while overcapping the sensor and/or actuator element. It is a further advantage of embodiments of the present invention that the fabrication of the capping structure can be performed ex situ (i.e. prior to and separate from its provision on the sensing and/or actuator device), thereby avoiding additional processing steps (e.g. cutting or etching steps) on very small areas of the device, which pose a high risk of damaging delicate structures (such as the sensor and/or actuator element). Furthermore, this ex situ fabrication enables to precisely tailor the capping structure using a wider range of techniques (e.g casting, extrusion and molding tools), which would not be feasible if the capping structure were to be formed in situ. It can also be manufactured with architectural features that define the position or help with a subsequent positioning of an added component over the sensing structure (e.g. a semi-permeable membrane).

The polymer casting material may be PDMS.

In embodiments, the capping structure may comprise a semi-permeable membrane made of a different polymer to that of the casting material allowing a polymer-specific diffusivity. The membrane or part thereof also may be made of a ceramic nano-porous layer with filter properties, acting as a selectively permeable membrane. It is a further advantage of embodiments of the present invention that the capping structure can be semi-permeable. The nano-porous layer may be a plate. It may be an alumina plate. The semi permeable membrane may allow avoiding certain material to contaminate the sensor area. The semi permeable membrane may for example be adapted for avoiding silicone oils to contaminate the sensor area.

The semi permeable membrane furthermore may comprise a temporary protective cover layer.

In embodiments, the capping structure overlaying the sensor and/or actuator element may be spaced therefrom by a distance of from 10 nm to 5 mm. It is an advantage of embodiments of the present invention that the capping structure can be spaced at a selected distance from the sensor and/or actuator element, e.g. forming a cavity in between the sensor and/or actuator element and the capping structure.

In a second aspect, the present invention relates to a use of a demarcation structure during encapsulation of a sensing and/or actuator device comprising a sensor and/or actuator element, for leaving the sensor and/or actuator element uncovered by an encapsulation material.

In a third aspect, the present invention relates to a use of a demarcation structure during encapsulation of a sensing and/or actuator device comprising a sensor and/or actuator element, for providing a capping structure overlaying the sensor and/or actuator element.

In embodiments, the use may further be for spacing the capping structure a selected distance from the sensor and/or actuator element.

In a fourth aspect, the present invention relates to an encapsulated sensing and/or actuator device comprising a substrate, a demarcation structure contacting the substrate and defining an enclosed area of the substrate, a sensor and/or actuator element in the enclosed area, and an encapsulation material covering the substrate outside the enclosed area, leaving the sensor and/or actuator element uncovered by the encapsulation material, wherein the demarcation structure further comprises a capping structure overlaying the sensing and/or actuator element or wherein the method comprises positioning a capping structure on the demarcation structure after the encapsulation material is provided, the capping structure overlaying the sensing and/or actuator element. The demarcation structure therefore may comprise architectural elements to host the capping structure (or other elements), which can be subsequently mounted above the uncovered area of the sensor.

The capping structure may comprise a semi-permeable membrane, possible also with different materials.

The capping structure may comprise a polymer material at both sides of the semi-permeable membrane.

The semi-permeable membrane may comprise an alumina nanopore plate.

The capping structure overlaying the sensing and/or actuator element may be spaced therefrom by a distance of from 10 nm to 5 mm.

In embodiments, the encapsulated sensing and/or actuator device may be adapted to be implantable in a living organism. It is an advantage of embodiments of the present invention that the sensing and/or actuator device can be implanted.

In a fifth aspect, the present invention relates to a system for encapsulating a sensing and/or actuator device, comprising:
  i. the sensing and/or actuator device comprising at least a substrate and a sensor and/or actuator element on the substrate;
  ii. a demarcation structure contacting the substrate and defining an enclosed area of the substrate, the enclosed area comprising at least the sensor and/or actuator element; and
  iii. a casting mould surrounding the sensing and/or actuator device and adapted to press the demarcation structure securely against the substrate.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1A:
FIGS. 1a to 1d are a schematic representation of different steps in the encapsulation of a sensing device, using a demarcation structure to leave a sensing and/or actuator element uncovered.

In the different figures, the same reference signs refer to the same or analogous elements.

DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing absolute positions. It is to be understood that the terms so used are interchangeable with their antonyms under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

An element described of an apparatus embodiment is an example of a means for carrying out the function performed by the element for the purpose of carrying out the invention and corresponds with a method step providing the functionality.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein, and unless otherwise provided, any structure may typically have a length, a width and a height; these dimensions being defined with respect to the substrate of the sensing device. The height of the structure is typically the dimension perpendicular to the substrate. The width and length of a structure are typically the shortest and the longest dimensions, respectively, parallel to the substrate.

As used herein, and unless otherwise provided, a sensing and/or actuator element is at least a portion of a sensor. The sensing and/or actuator element may typically comprise a portion of the sensor that should not be covered by the encapsulation, e.g. a sensing portion of the sensor. In some embodiments, the sensing and/or actuator element may be the whole sensor.

In a first aspect, the present invention relates to a method for encapsulating a sensing device, comprising, In step a, providing a sensing and/or actuator device having a demarcation structure thereon, the sensing and/or actuator device comprising at least a substrate and a sensing and/or actuator element on the substrate, the demarcation structure contacting the substrate and defining an enclosed area of the substrate, the enclosed area comprising at least the sensing and/or actuator element; and in step b, providing an encapsulation material outside the enclosed area, such that the sensing and/or actuator element is left uncovered by the encapsulation material.

The demarcation structure further comprises a capping structure overlaying the sensing and/or actuator element, or the method comprises positioning a capping structure on the demarcation structure after the encapsulation material is provided, the capping structure overlaying the sensing and/or actuator element. The sensing and/or actuator device comprises at least a substrate and a sensing and/or actuator element thereon, and may typically further comprise an integrated circuit (e.g. coupled to the sensing and/or actuator element such as for example a photonic integrated circuit or electronic integrated circuit. The sensing and/or actuator device may commonly be referred to as a microdevice. The encapsulated sensing and/or actuator device is preferably suitable for implantation into a living organism, e.g. the encapsulated sensing and/or actuator device is adapted for implantation into a living organism. The encapsulated sensing and/or actuator device thus may be an implantable sensing device. The sensing and/or actuator device may for example have a size which allows it to be implanted in the selected organism. Furthermore, the encapsulation material may be selected such that it is biocompatible with the selected organism. In embodiments, the sensing and/or actuator device may have a width and/or length of from 100 µm to 5 cm. In embodiments, the sensing and/or actuator device may have a height of from 1 um to 1 cm.

The substrate may typically be a semiconductor substrate, such as a semiconductor wafer or a semiconductor-on-insulator substrate, e.g. silicon wafer or a silicon-on-insulator substrate. Nevertheless, the substrate may in general be any substrate capable of supporting the sensing and/or actuator element and further optional structures comprised in the sensing device. In cases wherein the sensing and/or actuator element is a portion (e.g. a sensing portion) of a larger sensor, the rest of the sensor may be considered to be part of the substrate. In some embodiments, the substrate may advantageously be a rigid substrate.

The sensor, comprising the sensing and/or actuator element, is typically a structure capable of measuring a parameter of an analyte. The analyte may for example be a biomolecule, e.g. glucose in a bodily fluid. The measurement performed by the sensor may for example be an optical, electrical, electrochemical or piezoelectric measurement and the measured parameter may typically correspond thereto.

The demarcation structure is a structure which defines (e.g. surrounds) the enclosed area around the sensing and/or actuator element. The demarcation structure hinders the encapsulation material from entering onto the enclosed area in step b, thereby keeping the sensing and/or actuator element free of the encapsulation material. Preferably, the demarcation structure may prevent the encapsulation material from entering onto the enclosed area altogether. In other cases, some amount of the encapsulation material may nevertheless enter onto the enclosed area, but the sensing and/or actuator element is left uncovered; e.g. the encapsulation material may cover an outer rim of the enclosed area (e.g. a portion of the sensor) while the sensing and/or actuator element (e.g. the sensing area of the sensor) remains uncovered. The demarcation structure may for example comprise a silicone rubber, although embodiments are not limited thereto. It may comprise the same or different material as the casting material. Alternative materials may for example be any other flexible biocompatible polymer (polyurethane) or a blend of polymers. It is understood that a plurality of sensing and/or actuator elements can be left uncovered, e.g. by enclosing a plurality of sensing and/or actuator elements by a single demarcation structure and/or by using a plurality of demarcation structures, each enclosing one or more sensing and/or actuator elements.

In preferred embodiments, the demarcation structure may comprise one or more walls standing upon the substrate and defining a cavity (i.e. a hollow) between said walls. The walls may also comprise architectural features, such as for example wings or hooks or rings, that allow mechanical interlocking of the wall with the encapsulation material. These architectural features might also be designed 'inwards' (into the cavity) and be designated to delimit the positions of other eventual structural elements placed at a secondary step into the sensing cavity. The demarcation structure thus can be a molded place holder for the capping structure, e.g. membrane, and the capping structure, e.g. membrane, can be placed after the casting has been performed. The cavity may typically correspond to an enclosed volume having the enclosed area as a base. It is understood here that the cavity is enclosed by the demarcation structure parallel to the substrate, but a top of the cavity may in some instances open up to the surroundings; i.e. in embodiments, the cavity may open up to a surrounding of the sensing device. In embodiments, the demarcation structure may have a height of from 1 µm to 5 mm. In embodiments, the demarcation structure may have a length and/or width of from 1 um to 5 mm or larger, i.e. as long as the sensor and/or actuator element requires. In embodiments, the walls may have a thickness of from 10 nm to 500 µm or larger.

In embodiments, the demarcation structure may further comprise a capping structure overlaying the sensing and/or actuator element. The capping structure may typically close off the volume enclosed by the demarcation structure, thereby forming a confined cavity around the sensing and/or actuator element and enclosed by the demarcation structure, the substrate and the capping structure. In other cases, the capping structure may comprise an opening which connects the cavity to the surroundings. In some embodiments, the capping structure may lie directly upon the sensing and/or actuator element. In other embodiments, the capping structure overlaying the sensing and/or actuator element may be spaced therefrom by a distance of from 10 nm to 500 µm. This may be particularly useful in e.g. optical sensors, where it may be desired to have a cavity with a carefully controlled distance between the optical sensing area and the capping structure.

The capping structure can advantageously be fabricated separately from the encapsulation material and from the rest of the demarcation structure. This allows a much wider spectrum of processing techniques (e.g. polymer forming and casting techniques) and materials to be exploited in its formation. Depending on the application that is envisaged, the capping structure can advantageously be made of the same material as the encapsulation material or it can be made of a different material. The capping structure and/or the rest of the demarcation structure (e.g. the one or more walls) may be configured to securely connect, interlock, attach or integrate in a mechanical fashion if e.g. chemical adhesion is not provided, the capping structure to the rest of the demarcation structure. This can for example be achieved by means of mechanically interlocking structures. These interlocking structures can for instance comprise circular openings, parallel slits or 'anchor'-like hook patterns, e.g. near a rim of the capping structure. The capping structure may often comprise materials which are inert and/or have low adhesive properties, as such issues with the adhesion of the capping structure can advantageously be addressed by such a configuration. Furthermore, this configuration enables the capping structure to continue performing its function, even under conditions where it would otherwise delaminate from the sensing device.

In embodiments, the capping structure may comprise a semi-permeable membrane. The semi-permeable membrane is a membrane which allows one or more analytes to traverse the membrane, selectively with respect to one or more other molecules. 'Selectively' here means that the one or more analytes traverse the membrane more than the one or more other molecules; preferably at least twice more, more preferably at least five times more, yet more preferably at least 10 times more; most preferably the one or more other molecules may substantially not traverse the membrane. The semi-permeable membrane may be used to allow only specific analytes into the cavity, thereby enabling a selective measurement of the analytes by the sensor. This is most useful where the sensor as such would otherwise not display this selectivity. The semi-permeable membrane may be made of a polymeric material, such as a thermoplastic polyurethane or a ceramic, such as porous aluminium oxide, silicon carbide, aluminium nitride or porous diamond or diamond-like carbon.

Where in embodiments of the present invention reference is made to a membrane, the membrane may be a sheet of one or more materials providing a barrier between spaces. Membranes advantageously may be semi-permeable, allowing diffusion of one or more selected components. Additionally, the membrane may comprise one or more materials providing additional functionality, such as for example restricting or avoiding swelling of the membrane in a lateral direction or providing mechanical support. Such components therefore may provide an interlocking functionality for the membrane.

In some embodiments, step b may comprise coating (e.g. through vapour deposition) the encapsulation material outside the enclosed area. In preferred embodiments, step b may comprise casting the encapsulation material outside the enclosed area. In embodiments, a casting mould may be provided around the sensing and/or actuator device prior to the casting. It is to be noted that any type of casting material may be applicable. In embodiments, step b may further comprise curing the encapsulation material. Step b may for example comprise:

casting the encapsulation material outside the enclosed area; and
curing the encapsulation material.

The encapsulation achieved after step b preferably comprises a hydrothermally stable adhesion to the sensing device. The encapsulation may conformally cover the entire sensing and/or actuator device or only a portion thereof, such as only one or more sides of the sensing device.

The encapsulation material may be a viscous material, such as a viscous polymer (e.g. an elastomer). The encapsulation material may typically have adhesive, such as highly adhesive, properties. The encapsulation material may for example comprise a silicone rubber, an epoxy material or polyurethane. Silicone rubber or an epoxy material may typically be provided using a casting technique. The encapsulation material may often comprise two or more components, such as a two-component silicone rubber.

The casting mould may be made of a relatively solid material (e.g. Teflon or PTFE-coated metal). The casting mould may preferably be adapted to press the demarcation structure securely against the substrate. The shape of the casting mould may for example be configured such that the casting mould, when closed, physically presses the demarcation structure and the substrate together. Pressing the demarcation structure securely against the substrate is advantageous in order to prevent encapsulation material from entering onto the enclosed area through a gap between the demarcation structure and the substrate. For this purpose, it may be useful for the substrate to be a rigid substrate while keeping the demarcation structure flexible, as a flexible substrate may deform, particularly when the casting mould presses onto it; such that a gap opens up between the demarcation structure and the substrate. Alternatively, the deformation of the flexible substrate may also lead to damage to the sensing element.

Due to the nature of the encapsulation material (e.g. the adhesive behaviour), the demarcation structure may typically be incorporated in the encapsulation; i.e. the encapsulation material may at least partially engulf the demarcation structure. In some cases, the demarcation structure (or a portion thereof, such as one or more walls) may blend into the encapsulation to form substantially a single structure; i.e. an edge of the demarcation structure may become ill-defined or even indistinguishable with respect to the encapsulation material. This can for example occur when the demarcation structure comprises a material which becomes plastic under some of the curing conditions used and can then intermix with the encapsulation material. This may particularly occur when the demarcation structure and the encapsulation material comprise a same material. This blending can sometimes be preferred, as it allows a more solid integration of the demarcation structure into the whole of the encapsulation, with a reduced risk of the demarcation structure separating therefrom during the lifetime of the device. Similar considerations pertaining to the reduced risk of separation apply to the capping structure, when it is interlocked with the rest of a demarcation structure blended together with the encapsulation material.

In embodiments, any feature of any embodiment of the first aspect may independently be as described for any embodiment of any of the other aspects.

In a second aspect, the present invention relates to a use of a demarcation structure during encapsulation of a sensing and/or actuator device comprising a sensing and/or actuator element, for leaving the sensing and/or actuator element uncovered by an encapsulation material.

In embodiments, any feature of any embodiment of the second aspect may independently be as described for any embodiment of any of the other aspects.

In a third aspect, the present invention relates to a use of a demarcation structure during encapsulation of a sensing and/or actuator device comprising a sensing and/or actuator element, for providing a capping structure overlaying the sensing and/or actuator element.

In embodiments, the use may further be for spacing the capping structure a selected distance from the sensing and/or actuator element.

In preferred embodiments, the use may simultaneously be for leaving the sensing and/or actuator element uncovered by the encapsulation material and for providing the capping structure overlaying the sensing and/or actuator element, and optionally for spacing the capping structure a selected distance from the sensing and/or actuator element. In other words, the demarcation structure has at least two uses which may occur concurrently but should in general be considered to be independent from one another. Indeed, it is self-evident that a demarcation structure can be used solely for leaving the sensing and/or actuator element uncovered by the encapsulation material, particularly when the demarcation structure does not comprise a capping structure. Likewise, there may be cases where a capping structure is to be provided, while there is no desire to keep the sensing and/or actuator element uncovered.

In embodiments, any feature of any embodiment of the third aspect may independently be as described for any embodiment of any of the other aspects.

In a fourth aspect, the present invention relates to an encapsulated sensing and/or actuator device comprising:
  i. a substrate;
  ii. a demarcation structure contacting the substrate and defining an enclosed area of the substrate,
  iii. a sensing and/or actuator element in the enclosed area; and
  iv. an encapsulation material covering the substrate outside the enclosed area, leaving the sensing and/or actuator element uncovered by the encapsulation material.

The demarcation structure further comprises a capping structure overlaying the sensing and/or actuator element. The capping structure may be applied prior providing the encapsulation material or after the encapsulation material has been applied.

In embodiments, the encapsulated sensing and/or actuator device may be adapted to be implantable in a living organism. It thus may be an implantable sensing device.

In embodiments, any feature of any embodiment of the fourth aspect may independently be as described for any embodiment of any of the other aspects.

For example, in some embodiments, a capping structure may be provided for covering the sensor. The capping structure can advantageously be made of the same material as the encapsulation material or it can be made of a different material. The material selection may be such as to provide a good fixing of the capping structure, which may provide for example a better fixing than if the capping structure would be fixed to the encapsulation material.

The capping structure and/or the rest of the demarcation structure (e.g. the one or more walls) may be configured to securely connect the capping structure to the rest of the demarcation structure. This can for example be achieved by means of mechanically interlocking structures. These interlocking structures can for instance comprise circular openings, parallel slits or 'anchor'-like hook patterns, e.g. near a rim of the capping structure. The capping structure may often comprise materials which are inert and/or have low adhesive properties, as such issues with the adhesion of the capping structure can advantageously be addressed by such a configuration. Furthermore, this configuration enables the capping structure to continue performing its function, even under conditions where it would otherwise delaminate from the sensing device.

The polymer casting material used in embodiments may be PDMS.

In embodiments, the capping structure may comprise a semi-permeable membrane made of a different polymer to that of the casting material allowing a polymer-specific diffusivity. The membrane or part thereof also may be made of a ceramic nano-porous layer with filter properties, acting as a selectively permeable membrane. It is a further advantage of embodiments of the present invention that the capping structure can be semi-permeable. The nano-porous layer may be a plate. It may be an alumina plate. The semi permeable membrane may allow avoiding certain material to contaminate the sensor area. The semi permeable membrane may for example be adapted for avoiding silicone oils to contaminate the sensor area.

The semi permeable membrane furthermore may comprise a temporary protective cover layer.

In a fifth aspect, the present invention relates to a kit of parts for encapsulating a sensing device, comprising:
  i. the sensing and/or actuator device comprising at least a substrate and a sensing and/or actuator element on the substrate;
  ii. a demarcation structure contacting the substrate and defining an enclosed area of the substrate, the enclosed area comprising at least the sensing and/or actuator element; and
  iii. a casting mould surrounding the sensing and/or actuator device and adapted to press the demarcation structure securely against the substrate.

In embodiments, any feature of any embodiment of the fifth aspect may independently be as described for any embodiment of any of the other aspects.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

Example 1

Encapsulation of a Sensing and/or Actuator Device while Leaving a Sensing and/or Actuator Element Uncovered Reference is made to FIGS. 1a to 1d, showing different steps in the encapsulation of a sensing and/or actuator device 100 using a demarcation structure 400 to leave a sensing and/or actuator element 310 uncovered; in accordance with the present invention.

We now refer to FIG. 1a. A first half 610 of a casting mould 600 is provided, which is configured with a first architectural element 650 such that a demarcation structure 400 can be held thereon. Different shapes are possible for the demarcation structure 400, as explained in example 2. The shape and dimensions of the demarcation structure 400 will determine the enclosed area 450 and thus indirectly the section that will be left uncovered. As such, these are typically selected in function of the characteristics of the desired section to be left uncovered (e.g. in function of the dimensions of the sensing and/or actuator element 310).

Figure 1B:
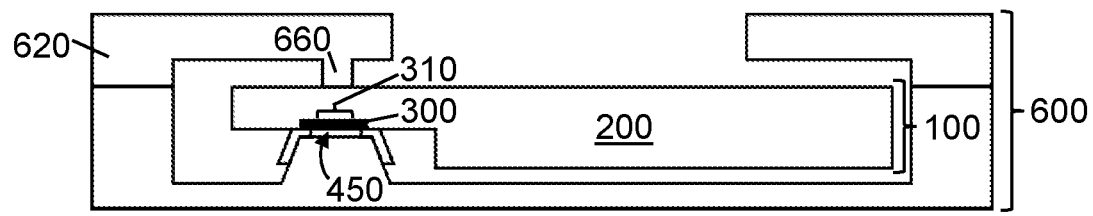

We now refer to FIG. 1b. The sensing and/or actuator device 100, comprising at least a substrate 200 and a sensing and/or actuator element 310, is mounted into the first half 610 of the casting mould, such that at least the sensing and/or actuator element 310 sits in the enclosed area 450. In this example, the sensing and/or actuator element 310 is a portion of a larger sensor 300 (wherein the rest of said sensor 300 is considered to be a part of the substrate 200). Subsequently, the second half 620 of the casting mould 600 is provided over the sensing and/or actuator device 100. The second half 620 of the casting mould is configured with a second architectural element 660. Between the first 650 and second 660 architectural elements, the demarcation structure 400 is securely pressed onto the substrate 200 such that a tight contact between the two is achieved. Here, the substrate 200 is preferably a rigid substrate, such that it does not significantly deform under the forces applied; while the demarcation structure 400 preferably comprises a soft material, such that a tight fit can be achieved without damaging the substrate 200 (e.g. without damage the rest of the larger sensor 300).

Figure 1C:
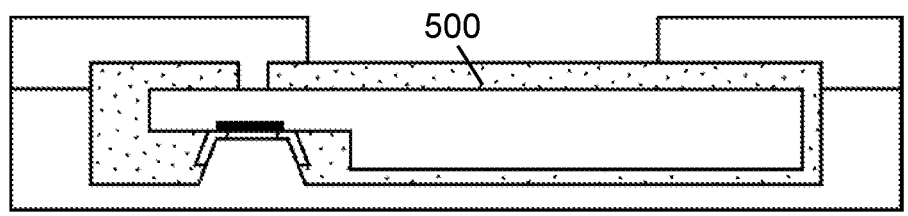

We now refer to FIG. 1c. The casting mould 600 is then filled with an encapsulation material 500. By virtue of the demarcation structure 400, the encapsulation material 500 is hindered from entering onto the enclosed area 450. A curing step is performed to solidify the encapsulation material 500. As depicted in FIG. 1c, the demarcation structure 400 is partially incorporated in the encapsulation material 500, but still distinguishable therefrom. In other cases however (not depicted in FIG. 1c), the limit between the demarcation structure 400 and the encapsulation material 500 may be blurred.

Figure 1D:
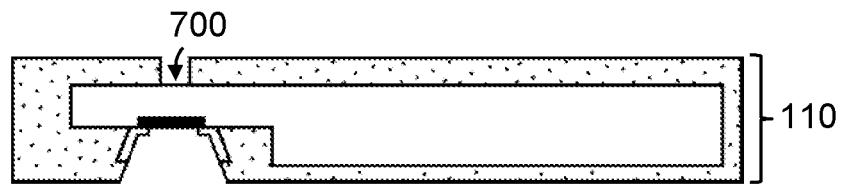

We now refer to FIG. 1d. The casting mould 600 is removed and an encapsulated sensing and/or actuator device 110 is obtained. The encapsulation conformally covers the sensing and/or actuator device 100 but leaves the sensing and/or actuator element 310 uncovered. Additionally, also other areas 700 of the sensing and/or actuator device 100 may be left uncovered, for example where the second architectural element 660 of the casting mould 600 was located; these do not normally impair the sensing and/or actuator device 100 or the quality of its encapsulation.

Comparative Example

Figure 2A:
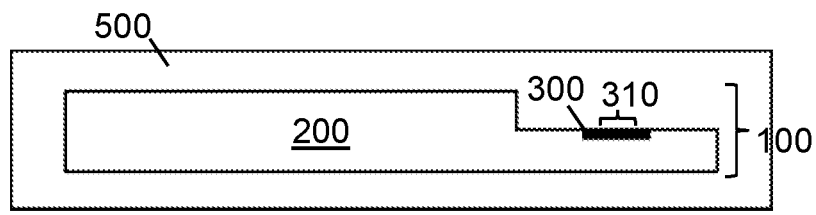
FIGS. 2a to 2c are a schematic representation of different steps in the encapsulation of a sensing and/or actuator device and the subsequent uncovering of the sensing and/or actuator element, in accordance with the prior art.
Figure 2B:
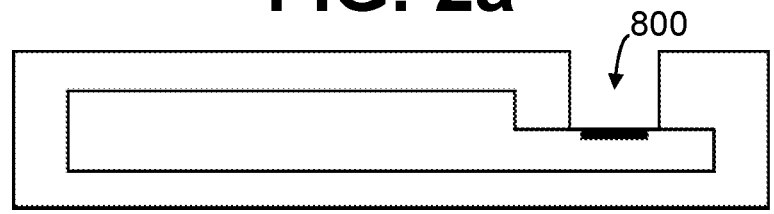
Figure 2C:
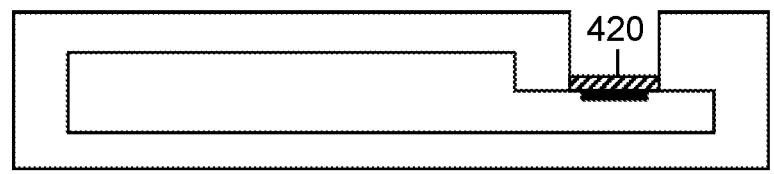

Encapsulation of a Sensing and/or Actuator Device and Subsequent Exposure of a Sensing and/or Actuator Element, in Accordance with the Prior Art Reference is made to FIGS. 2a to 2c, showing different steps in the encapsulation of a sensing and/or actuator device 100 and the subsequent uncovering of the sensing and/or actuator element 310; in accordance with the prior art.

We now refer to FIG. 2a. A sensing and/or actuator device 100 was provided, comprising a sensing and/or actuator element 310 of as sensor 300 on a substrate 200. The whole sensing and/or actuator device 100 was then conformally encapsulated using a soft polymeric encapsulation material 500 (e.g. a silicone rubber), using methods that are well known in the art.

We now refer to FIG. 2b. A post-processing step was performed to uncover an area 800 comprising the sensing and/or actuator element 310. This step of re-exposing the sensing and/or actuator element 310 could for example be performed though manual cutting, laser-assisted cutting, wet etching or reactive plasma etching. This step was typically precarious to perform, as the sensing and/or actuator element 310 is easily damaged in the process. Furthermore, at least some of these steps often require additional processing steps such as masking (e.g. using tape or a photo-resist mask).

We now refer to FIG. 2c. If the sensing and/or actuator element 310 could be uncovered without damaging it, a capping structure 420 (e.g. a semi-permeable membrane) could be provided on top of the sensing and/or actuator element 310. This could for example be done using spray-coating, solvent-casting or dip coating of the capping structure 420. However, as the capping structure 420 was provided in an opening, it was difficult to securely attach it. Particularly since these capping structures 420 usually comprise non-adherent polymers, they tend to swell and delaminate upon exposure to fluids. Due to the lack of attachment, the delamination of the capping structure 420 could easily expose the sensing and/or actuator element 310 and undo any function of the capping structure 420. Furthermore, providing the capping structure 420 in this way almost inevitably leads to the capping structure 420 lying directly on the sensing and/or actuator element 310; there was thus no straightforward way of ensuring a gap between the sensing and/or actuator element 310 and the capping structure 420, especially when it is desirable for the size of said gap to be well controlled.

Example 2

Demarcation Structures

Figures 3A, 3B, 3C:
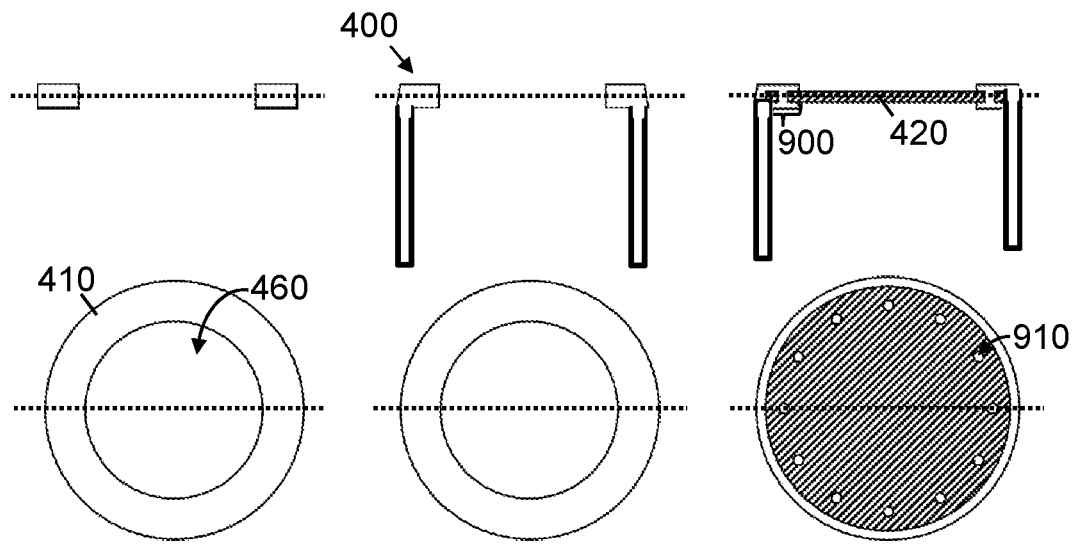
FIGS. 3a to 3c are a schematic representation of horizontal (top) and vertical (bottom) cross-sections of different demarcation structures.

Reference is made to FIGS. 3a to 3c, wherein several different demarcation structures 400 are depicted. In each case, a horizontal (top) and vertical (bottom) cross-section are shown; the location where the vertical cross-section is taken is indicated on the horizontal cross-section by a dotted line, and vice versa.

We now refer to FIG. 3a. A simple demarcation structure 400 is shown, with a wall 410 in the shape of an O-ring and defining a cavity 460 therebetween. In the example shown, the O-ring has a circular (or conical) horizontal cross-section. However, the horizontal cross-section may also have a variety of other geometric shapes, such as oval, rectangular or square. The demarcation structure 400 may for instance be made of a silicone rubber.

We now refer to FIG. 3b. A variation of the previous demarcation structure 400 is shown having a more elaborate 3D structure, where the wall further expands conically from the O-ring. This expanded structure can be beneficial in positioning and aligning the demarcation structure 400 to the first architectural element of the casting mould.

We now refer to FIG. 3c. The demarcation structure 400 is similar as in FIG. 3b, but an additional capping structure 420 is present. The capping structure 420 may for example be a semi-permeable membrane of a polymeric material (e.g. a thermoplastic polyurethane) having specific diffusive properties; e.g. to serve as an analyte-selective membrane over the sensor. Furthermore, such a demarcation structure 400 has the advantage that the position of the capping structure 420, with respect to the top of the demarcation structure 400, can be well defined. Therefore, the gap that will be formed between the sensing and/or actuator element and the capping structure 420 can be well controlled through a suitable design of the demarcation structure 400. The capping structure 420 can be secured to the rest of the demarcation structure 400 by means of mechanically interlocking structures 900. In the example shown, these interlocking structures can comprise circular openings 910 near the rim of the capping structure. While the capping structure 420 in FIG. 3c has a flat circular shape, again more elaborate 3D shapes (e.g. a dome shape) can envisioned.

Example 3

Encapsulation of a Sensing and/or Actuator Device while Leaving a Sensing and/or Actuator Element Uncovered and Providing a Capping Structure Spaced a Selected Distance from the Sensing and/or Actuator Element Example 1 is repeated, but a demarcation structure 400 is used such as depicted in FIG. 3c. The demarcation structure 400 is designed such that the capping structure 420 (e.g. a semi-permeable membrane) has a well-defined position with respect to the top of the demarcation structure. This well-defined position is selected in function of a desired gap between the capping structure 420 and the sensing and/or actuator element. Through these design selections, an encapsulated sensing and/or actuator device 110 is obtained comprising the capping structure 420 overlaying the sensing and/or actuator element and spaced therefrom by the selected distance.

Figure 4:
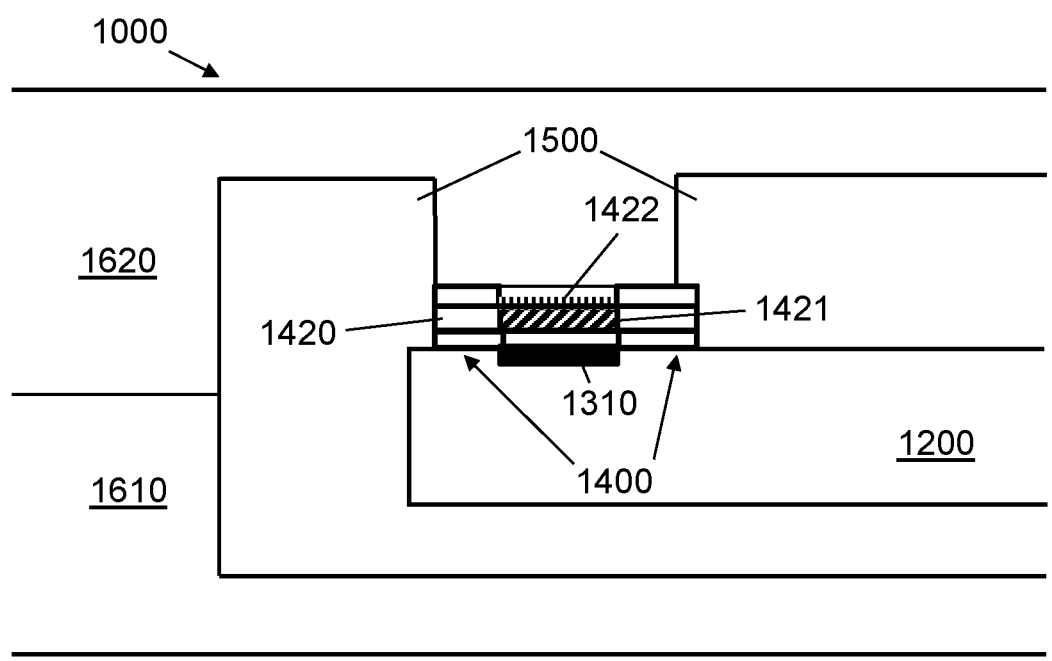
FIG. 4 illustrates a device according to an embodiment of the present invention.

By way of illustration, embodiments not being limited thereto, an example of an encapsulated sensing and/or actuator device is shown in FIG. 4. The device 1000 comprises a substrate 1200, a demarcation structure 1400 contacting the substrate and defining an enclosed area of the substrate and a sensing and/or actuator element in the enclosed area. The demarcation structure 1400 furthermore comprises a capping structure 1420 for covering the sensing and/or actuator element 1310. The device 1000 also comprises an encapsulation material 1500 covering the substrate 1200 outside the enclosed area, leaving the sensing and/or actuator element 1310 uncovered by the encapsulation material 1500.

The encapsulation material 1500 typically may be prevented from covering the sensing element for example by using a non-porous holder element, providing an additional cover layer or leaving the membrane closed, e.g. temporarily leaving the membrane closed.

The encapsulation material 1500 may be a silicone rubber. The capping structure comprises a semi permeable membrane 1421. The semi permeable membrane in the present example is an alumina nano-porous plate. A temporary protective layer 1422 can be on top of the nano-porous plate. The capping structure 1420 also may comprise polymer material, which may be the same or different from the encapsulation material, and which may be used for holding the membrane. The device also typically comprises a casting mold 1610, 1620.

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A method for encapsulating a sensing and/or actuator device, comprising:
   a. providing a sensing and/or actuator device having a demarcation structure thereon, the sensing and/or actuator device comprising at least a substrate and a sensing and/or actuator element on the substrate, the demarcation structure contacting the substrate and defining an enclosed area of the substrate, the enclosed area comprising at least the sensing and/or actuator element; and
   b. providing an encapsulation material outside the enclosed area, such that the sensing and/or actuator element is left uncovered by the encapsulation material and such that the sensing and/or actuator element can be exposed,
   wherein the demarcation structure further comprises a capping structure overlaying the sensing and/or actuator element or wherein the method comprises positioning a capping structure on the demarcation structure after the encapsulation material is provided, the capping structure overlaying the sensing and/or actuator element,
   wherein the capping structure comprises a semi-permeable membrane that allows one or more analytes to transverse the semi-permeable membrane selectively with respect to one or more other molecules.

2. The method according to claim 1, wherein the capping structure comprises a polymer material at one or both sides of the semi-permeable membrane.

3. The method according to claim 1, wherein the semi-permeable membrane comprises an alumina nanopore plate.

4. The method according to claim 1, wherein the capping structure overlaying the sensing and/or actuator element is spaced therefrom by a distance of from 10 nm to 5 mm.

5. The method according to claim 1, wherein step b comprises casting the encapsulation material outside the enclosed area.

6. The method according to claim 5, wherein a casting mould is provided around the sensing and/or actuator device prior to the casting and wherein the casting mould is adapted to press the demarcation structure securely against the substrate.

7. An encapsulated sensing and/or actuator device comprising:
   i. a substrate;
   ii. a demarcation structure contacting the substrate and defining an enclosed area of the substrate,
   iii. a sensing and/or actuator element in the enclosed area; and
   iv. an encapsulation material covering the substrate outside the enclosed area, leaving the sensing and/or actuator element uncovered by the encapsulation material and such that the sensing and/or actuator element can be exposed,
   wherein the demarcation structure further comprises a capping structure overlaying the sensing and/or actuator element, the capping structure comprising a semi-permeable membrane that allows one or more analytes to transverse the semi-permeable membrane selectively with respect to one or more other molecules.

8. The encapsulated sensing and/or actuator device according to claim 7, wherein the capping structure comprises a polymer material at both sides of the semi-permeable membrane.

9. The encapsulated sensing and/or actuator device according to claim 7, wherein the semi-permeable membrane comprises an alumina nanopore plate.

10. The encapsulated sensing and/or actuator device according to claim 7, wherein the capping structure overlaying the sensing and/or actuator element is spaced therefrom by a distance of from 10 nm to 5 mm.

11. The encapsulated device according to claim 7, wherein the demarcation structure comprises interlocking features for locking a capping structure to the demarcation structure.

12. The encapsulated device according to claim 7, wherein the demarcation structure is configured for introducing a predetermined distance between the sensing and/or actuator element and the capping structure so that the capping structure is not touching the sensing and/or actuator element.

13. The encapsulated sensing and/or actuator device according to claim 7, wherein the encapsulated sensing and/or actuator device is adapted to be implantable in a living organism.

14. The encapsulated sensing and/or actuator device according to claim 7, wherein the semi-permeable membrane includes a polymeric material having a specific diffusivity.

15. The encapsulated sensing and/or actuator device according to claim 7, wherein the semi-permeable membrane includes ceramic nano-porous layer with filter properties acting as a selectively permeable membrane.

* * * * *